19--775
5/6/86 OR H 000,067

United States Statutory Invention Registration [19]

[11] Reg. Number: H67
[45] Published: May 6, 1986

Mori

[54] CONVEYOR MECHANISM FOR THIN PLATE

[75] Inventor: Noriaki Mori, Hikone, Japan

[73] Assignee: Dainippon Screen Seizo Kabushiki Kaisha, Kyoto, Japan

[21] Appl. No.: 596,560

[22] Filed: Apr. 4, 1984

[51] Int. Cl.[4] ..... B65G 25/00
[52] U.S. Cl. ..... 198/775; 198/621; 414/221
[58] Field of Search ..... 198/775, 621, 774, 488, 198/487; 414/225, 750

[56] References Cited

U.S. PATENT DOCUMENTS

| | | | |
|---|---|---|---|
| 3,198,309 | 8/1965 | Ogawa | 198/488 |
| 3,834,213 | 9/1974 | Henzler et al. | 414/225 X |
| 3,885,680 | 5/1975 | Rasenberger | 198/621 X |
| 4,273,507 | 6/1981 | Herdzina et al. | 414/750 |
| 4,465,416 | 8/1984 | Burkhalter et al. | 198/488 X |

FOREIGN PATENT DOCUMENTS

| | | | |
|---|---|---|---|
| 2424223 | 11/1975 | Fed. Rep. of Germany | 198/487 |
| 2508841 | 9/1976 | Fed. Rep. of Germany | 198/488 |

*Primary Examiner*—Harold J. Tudor
*Attorney, Agent, or Firm*—Poms, Smith, Lande & Rose

[57] ABSTRACT

A conveyor mechanism suitable for a thin plate, especially for uniformly drying a photoresist coated on a wafer without smearing its rear surface with the photoresist has at least four grooves formed laterally in the upper surface of a table, two of the grooves extending from one side of the table and the other two from the opposite side. A movable frame is provided with its legs located outside the sides of the table. The legs are each provided with two fingers, the inner ends of which are allowed to downwardly enter the grooves so as to mount the thin plate on the table. They are kept aside while the thin plate is treated on the table. After completion of the treatment, the fingers are swung back into the grooves and are then moved upwards, thereby lifting the thus-treated thin plate from the table. Then, the frame is caused to move so that the thin plate is carried away.

1 Claim, 8 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

CONVEYOR MECHANISM FOR THIN PLATE

BACKGROUND OF THE INVENTION

1. Field of the Invention

This invention relates to a conveyor mechanism for a thin plate, and more specifically to an apparatus adapted to convey thin plates one after another from one treatment or processing table to another, for example, upon heating and drying thin plates such as semiconductor substrates (hereinafter called "wafers") or glass plates, which have in advance been coated with a photoresist automatically on a heating table and then cooling same on a cooling table.

2. Description of the Prior Art

Reference is first of all made to FIGS. 1 and 2 illustrating a conventional conveyor mechanism which has generally been used, in which there are shown a wafer 1 bearing a photoresist coated on the upper surface thereof, belt conveyors 2,2, a heating table 3, vertical grooves 4,4 formed in the upper surface of the heating table 3 at locations underneath the belt conveyors 2,2, an annular groove 5 formed in the upper surface of the heating table 3 and having a diameter substantially equal to the diameter of the wafer 1, and positioning pins 6,6.

In the illustrated mechanism, the wafer 1 which has been conveyed by the belt conveyors 2,2 and has been stopped above the annular groove 5 by means of the positioning pins 6,6 is mounted on the heating table 3 by either lowering the belt conveyors 2,2 relative to the heating table 3 or raising the heating table 3 relative to the belt conveyors 2,2 so that the belt conveyors 2,2 are received in their corresponding longitudinal grooves 4,4. Thereafter, the thus-mounted wafer 1 is sucked in place on the heating table 3 by means of a vacuum suction holder (not illustrated) and is then heated and dried.

In such a conveyor mechanism, the photoresist is softened in the course of the heating and drying of the wafer 1 on the heating table 3 because the photoresist becomes hotter. In some instances, the photoresist runs down from the circumference of the wafer 1 onto the annular groove 5 of the heating table 3 and the belt conveyors 2,2. When conveying the wafer 1, the photoresist adhered to the belt conveyors 2,2 may smear the rear surface of the wafer 1.

Furthermore, the wafer 2 is not heated at parts, which lie over the longitudinal grooves 4,4 of the heating table 3, by the heating table 3 directly. Thus, the temperature distribution becomes uneven in the wafer 1, leading to non-uniform drying of the photoresist.

The uniform drying of each photoresist has become an important issue, because integrated circuit (IC's) have been densified more and more and larger wafers have been more popularly employed in recent years.

In the meantime, there was proposed such a conveyor mechanism as depicted by way of example in FIGS. 3 and 4.

In FIGS. 3 and 4, numerals 11, 12, 13 and 14 correspond respectively to numerals 1, 3, 4 and 5 in the above-described prior art conveyor mechanism and thus indicate a wafer, heating table, longitudinal grooves and annular groove respectively.

Numeral 15 indicates a conveyor frame, which is constructed by connecting rectangular frames 16,16, which extend longitudinally from the rear to the front of the conveyor mechanism and are parallel to each other, together at their bottom frames by means of connecting bars 17. A plurality of upward projections 18 is provided on the upper edges of the top frames **15*a*,15*a*** at desired locations.

The conveyor frame 15 moves by drive means (omitted in the drawings) as illustrated by imaginary lines in FIG. 3. Thus, the conveyor frame 15 supports the wafer 11 bearing a photoresist coated thereon, which has been fed by belt conveyors 19, upwardly by the projections 18 and then conveys it to a position right above the heating table 12.

Then, the conveyor frame 15 moves downwardly. This causes each of the top frames **15*a*,15*a* and each of the projections 18 to sink fully within their corresponding longitudinal grooves 13,13. At the same time, the wafer 11 is sucked on the heating table 12** and is then heated and dried there.

The above-proposed conveyor mechanism may avoid smearing of the rear surface of each wafer 11 by a photoresist if the projections 18 are arranged to support the wafer 11 at locations somewhat inward from the circumference of the lower surface of the wafer 11. However, the conveyor mechanism is still unable to avoid non-uniform drying since there are the longitudinal grooves 13,13.

Although no drawings are incorporated herein, air film conveyors are also employed to convey wafers. They are however accompanied by such drawbacks that a wafer is shaken during its conveyance and is thus brought into contact at a circumferential part of its lower surface with the surface of a heating table, thereby causing its photoresist to stick on the surface of the heating table; and blown-up dust deposits on the surfaces of the wafer.

SUMMARY OF THE INVENTION

An object of this invention is to solve the above-mentioned shortcomings of conventional conveyor mechanisms, in other words, to provide a conveyor mechanism which permits uniform and smear-free processing or treatment of a thin plate, for example, uniform drying of a photoresist applied on the front surface of a wafer without smearing the rear surface of the wafer with the photoresist.

In one aspect of this invention, there is thus provided a conveyor mechanism for a thin plate, which comprises:

a table defining at least four grooves in the upper surface thereof, two of said grooves extending respectively in directions, which are substantially perpendicular to the direction of conveyance of the thin plate, from one of both sides of the table to peripheral parts of an area on which the thin plate is to be mounted, and the remaining two of said grooves extending respectively in directions, which are substantially perpendicular to the direction of conveyance of the thin plate, from the other side of the table to peripheral parts of the area;

a frame surrounding both sides of the table and movable along both sides of the table; and at least four fingers provided movably up and down with the frame and equipped at the inner ends thereof with their respective upward projections which are adapted to support the thin plate, and two of said fingers assuming positions in the vicinity of one of the sides of the table and the remaining two of said fingers assuming positions in the vicinity of the other side of the table so that the fingers are allowed to move downwardly into their corresponding grooves and then to move outwardly from their respective sides of the table so as to mount the thin plate on the table and thereafter, the fingers are allowed to move inwardly into their corresponding grooves and then to move upwardly so as to lift the thin plate from the table.

In the conveyor mechanism according to this invention, each wafer is conveyed while being supported at locations, which are adjacent to the circumference of the lower surface thereof, by means of the projections. Even if a photoresist is caused to run down onto the fingers and then to stick on the fingers during the heat treatment of the wafer, the rear surface is not smeared by the thus-run photoresist. Furthermore, the wafer-mounting table is slightly cut out at four locations or so in the peripheral part of the wafer-bearing area on the table. Therefore, the temperature distribution of the wafer is kept uniform during its heat treatment, thereby solving the possible danger of developing uneven drying.

The above and other objects, features and advantages of the present invention will become apparent from the following description and the appended claim, taken in conjunction with the accompanying drawings.

DETAILED DESCRIPTION OF THE INVENTION AND PREFERRED EMBODIMENTS

With reference to FIGS. 5 through 8, the present invention will hereinafter be described more specifically.

Figure 1:
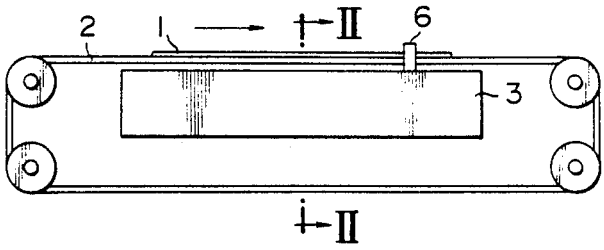
FIG. 1 PRIOR ART
FIG. 1 is a schematic side elevation of one example of conventional conveyor mechanisms.
Figure 2:
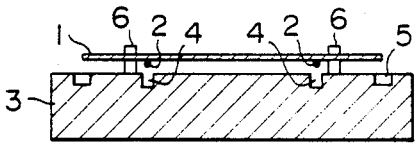
FIG. 2 PRIOR ART
FIG. 2 is a cross-sectional view taken along line II—II of FIG. 1.
Figure 3:
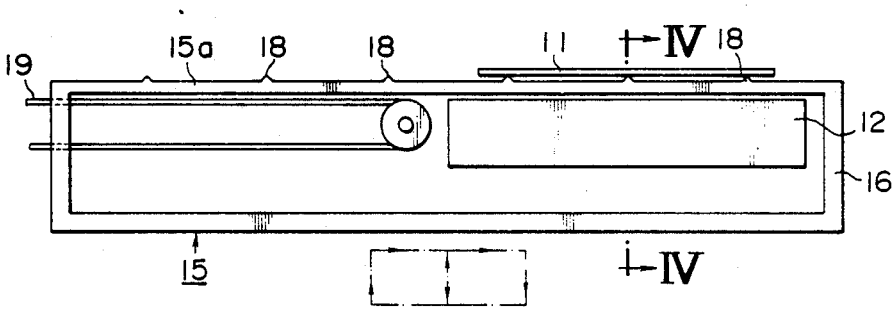
FIG. 3 PRIOR ART
FIG. 3 is a schematic side elevation, which shows another example of conventional conveyor mechanisms.
Figure 4:
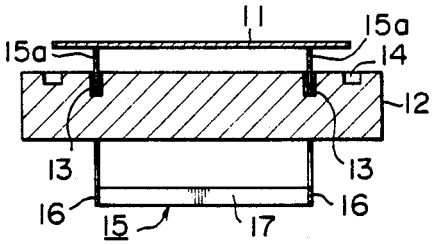
FIG. 4 PRIOR ART
FIG. 4 is a cross-sectional view taken along line IV—IV of FIG. 3.
Figure 5:
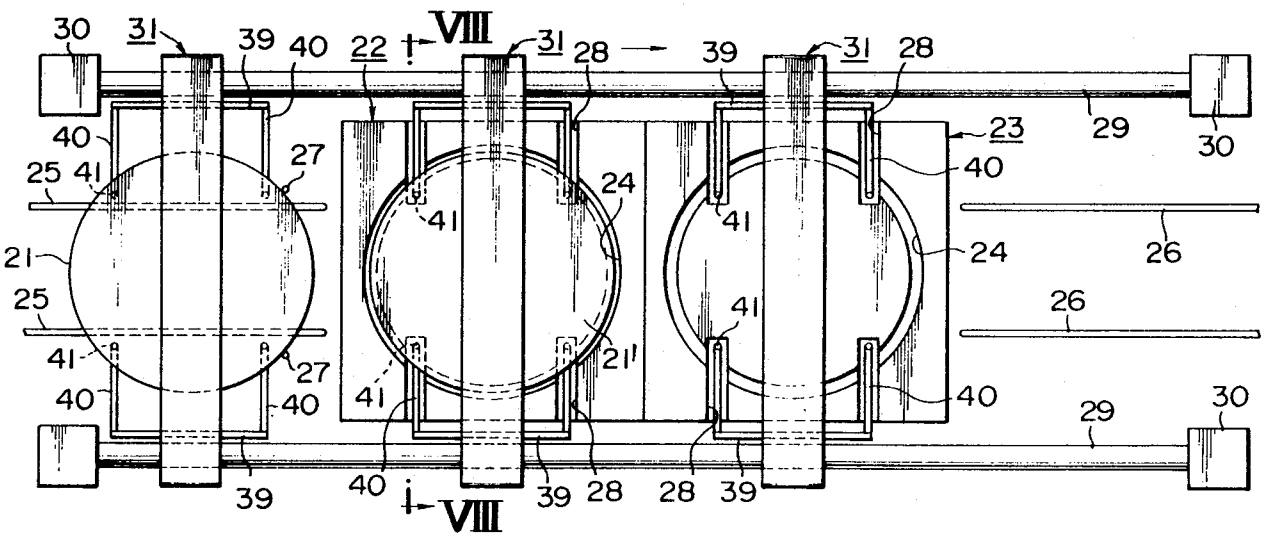
FIG. 5 is a plan view of a conveyor mechanism according to one embodiment of this invention.

Referring firstly to FIG. 5, designated at numerals 21,21′ are wafers. Numeral 22 indicates a heating table, while numeral 23 indicates a cooling table which has almost the same height as the heating table 22 and has the same external structure as the heating table 22 although their internal structures are different from each other. There are also illustrated an annular groove 24, belt conveyors 25,26 which serve to feed wafers and to carry away wafers respectively, and positioning pins 27.

In a front and rear parts of each side portion of each of the tables 22,23, there are formed grooves 28,28 which extend laterally from the side to points somewhat inside the annular groove 24.

Outwardly adjacent to both lower sides of the tables 22,23 and conveyors 25,26, guide rails 29,29 are provided in a pair on the floor by means of installation bases 30. The guide rails 29,29 extend parallelly to each other and in the direction of conveyance.

The lower extremities of gate-shaped frames 31 are slidably fit over the guide rails 29,29 with intervals equal to the distance between the center of the heating table 22 and the center of the cooling table 23. The number of the frames 31 is greater by one than the number of tables arranged one after another in the direction of conveyance.

Figure 8:
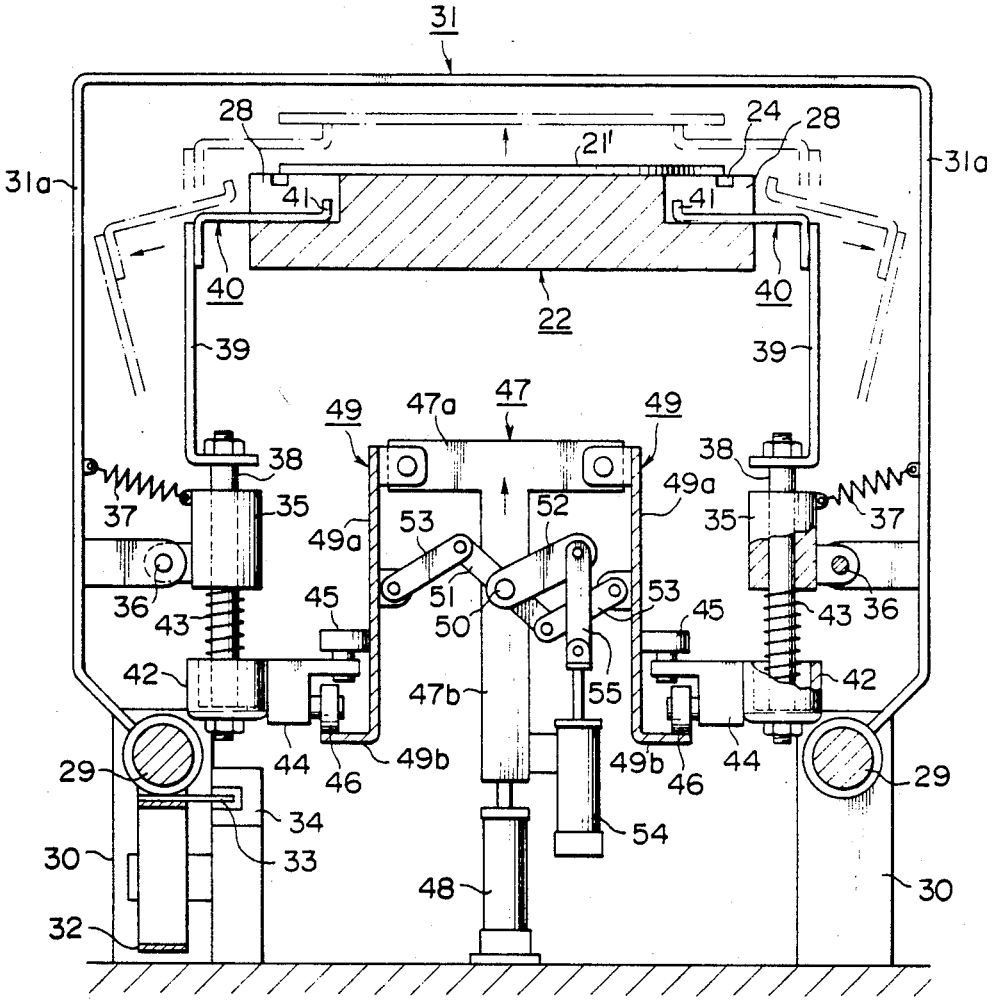
FIG. 8 is an enlarged cross-sectional view taken along line VIII—VIII of FIG. 5.

Reference is next made to FIG. 8. The lower extremeties of all the gate-shaped frames 31 are connected respectively at both sides of the conveyor mechanism by means of their respective endless belts 32, although the right hand endless belt is omitted in FIG. 8. These gate-shaped frames 31 are all driven synchronously by a motor (not illustrated). Each of the gate-shaped frames is stopped at prescribed positions owing to the combined provision of a light-shielding plate 33 attached to the lower extremity of the frame 31 and photosensors 34 provided right inside the travelling path of the lower extremity of the frame 31 at the prescribed positions, although only one of the photosensors 34 appears in FIG. 8.

Each of the gate-shaped frame 31 is formed of a pair of vertical portions 31*a* and a horizontal portion which connects the vertical portions 31*a* at their upper extremities. A cylindrical slider 35 is pivotally provided on the inner wall of each vertical portion 31*a* with its longitudinal central axis extending in the vertical direction, by way of a pin 36 which extends in the direction of conveyance. A tension spring 37 extends between the cylindrical slide 35 and its corresponding vertical portion 31*a* of the gate-shaped frame 31.

A vertically-displaceable shaft 38 is slidably fit through each of the cylindrical sliders 35 and an upright supporting plate 39 is fixedly provided on the upper extremity of the shaft 38.

Figure 6:
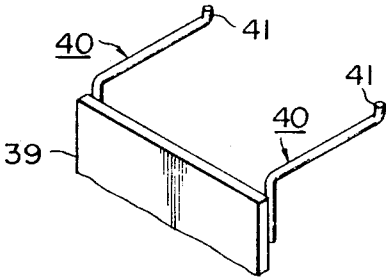
FIG. 6 is an enlarged perspective view of fingers.

As depicted in FIG. 6, a pair of fingers 40,40 is fixedly attached respectively to an upper front end portion and upper rear end portion of each supporting plate 39. The fingers 40,40 extend inwardly from the upper edge of their corresponding supporting plate 39 and parallelly to each other with an interval equal to the interval between the front groove 29 and the rear groove 28 of the heating table 22. An inner end portion of each finger 40 is bent upwardly, thereby forming an upward projection 41.

A cup-shaped spring shoe 42 is fixedly attached to the lower extremity of each of the vertically-displaceable shafts 38. The vertically-displaceable shaft 38 is thus biased downwardly by means of a compression spring 43 wound over the shaft 38 between the cylindrical slider 35 and spring shoe 42.

On the inner wall of each of the spring shoes 42, an inwardly-extending supporting block 44 is fixedly attached. The shafts of a vertical roller 45 and horizontal roller 46 are fixed to the free end of the supporting block 44.

Underneath the tables 22,23, a vertically-movable block 47 which has a T-like configuration as seen in FIG. 8 is supported displaceably up and down by an unillustrated support. A first air cylinder 48 is provided between the vertically-movable block 47 and the floor.

A pair of L-shaped guide plates 49,49 which extend in the direction of conveyance and parallelly to each other and have substantially the same lengths as the guide rails 29, is pivotally provided at the upper edges thereof with their corresponding lateral ends of a horizontal portion 47*a* of the vertically-movable block 47.

Against the outer surface of a vertical wall 49*a* and the upper surface of a horizontal wall 49*b* of each of the guide plates 49,49, their corresponding vertical rollers 45 and horizontal rollers 46 are always pressed owing to the biasing forces of their corresponding tension springs 37 and compression springs 43. A pivot 50 is turnably and centrally provided at the center of a vertical portion 47*b* of the vertically-movable block 47 with the longitudinal central axis of the pivot 50 extending in the direction of conveyance. A turnable plate 51 and connecting plate 52 are fixedly attached respectively at the center and one end thereof to the pivot 50.

Both ends of the turnable plate 51 are respectively connected to the central inner surface areas of the vertical walls 49*a*,49*a* of the guide plates 49,49 by way of their corresponding first links 53,53. The other end of the connecting plate 52 is coupled via a second link 55 to the free end of the piston rod of a second air cylinder 54 which is fixedly provided on the vertical portion 47*b* of the vertically-movable block 47 with its central axis extending in the vertical direction.

In FIGS. 5 and 8, the frontmost wafer 21 is in the course of its heating and drying while being sucked on the heating table 22. The next wafer 21' which is supported on the feeding belt conveyor 25 has been stopped at the prescribed position by the positioning pins 27,27 and is waiting for its turn. The first air cylinder 48 has been contracted whereas the second air cylinder 54 has been expanded. Thus, the free end of each finger 40 is positioned underneath the level of the wafer 21 or 21'. The fingers 40, which are located below the wafer 21, are received in their corresponding grooves 28 of the heating table 22.

When the heat treatment of the wafer 21 has been completed upon an elapsed time of a time preset by a timer (not shown), the first air cylinder 48 undergoes expansion so as to raise the vertically-movable block 47, guide plates 49, 49, supporting blocks 44,44 and spring shoes 42,42. Accordingly, the vertically-displaceable shafts 38,38 move upwardly together with their corresponding supporting plates 39,39 against the biasing forces of the compression springs 43,43. As indicated by imaginary lines in FIG. 8, the fingers 40,40 ascend to a level above the upper surface of the heating table 22 while supporting their corresponding wafers 21,21' at positions adjacent to the circumferences of their lower surfaces.

Then, the endless belts 32 are driven and each of gate-shaped frames 31 is caused to advance only by the distance between the center of the heating table 22 and that of the cooling table 23. Thus, the gate-shaped frames 31 are stopped there.

Since the rollers 45,46 mounted turnably on their corresponding supporting blocks 44,44 are kept under pressed contact with the lower bent portions of their corresponding guide plates 49,49 by virtue of the biasing forces of the springs 37,43 at this time, the attitudes of the supporting plates 39,39 are kept unchanged while their corresponding gate-shaped frame 31 are travelling. Therefore, the wafer 21 does not drop from the fingers 40,40.

Thereafter, the first air cylinder 48 undergoes a contraction and the vertically-displaceable shafts 38,38 thus descend together with their corresponding guide plates 49 by virtue of the biasing forces of the springs 43,43. Hence, the fingers 40,40 are caused to move downwardly into their corresponding grooves 28,28, thereby mounting the wafer 21' on the heating table 22 and mounting the thus-heated wafer 21 on the cooling table 23.

The second air cylinder 54 is next caused to contract so that the guide plates 49,49 are swung at their lower edges in the mutually-approaching directions. The vertically-displaceable shafts 38 are turned together with their corresponding cylindrical sliders 35,35 by virtue of the biasing forces of the tension springs 37,37 while maintaining the rollers 45,46 contacted under pressure with their corresponding guide plates 49,49. Therefore, the fingers 40,40 which have been received within the grooves 28,28 are retreated outwardly of the tables 22,23 as depicted by the phantom lines in FIG. 8.

Then, the gate-shaped frames 31 are caused to travel backwards to their respective positions shown in FIG. 5. The second air cylinder 54 is caused to expand. This permits the free end portions of the fingers 40 of the rearmost gate-shaped frame 31 (i.e., the leftmost gate-shaped frame 31 as seen in FIG. 5) to enter from the side positions to positions underneath the wafer 21' kept ready on the feeding belt conveyor 25 for its heat treatment. At the same time, the fingers 40 of the other gate-shaped frames 31,31 are also caused to enter their corresponding grooves 28 of the tables 22,23 from their retreated side positions.

By repeating the above-described operation, a number of wafers 21 which have been fed by the feeding belt conveyor 25 is automatically and successively subjected to a heat treatment and cooling treatment, and the thus-treated wafers 21 are then loaded on the discharging belt conveyor 26.

As mentioned above, the conveyor mechanism of this invention conveys each wafer 21 while supporting same at positions adjacent to the circumference of its lower surface by means of projections 41 formed at the tip portions of the fingers 40. Thus, the rear surface of the wafer 21 is protected from smearing even if the photoresist is allowed to run down onto the fingers 40 and to stick there during the heat treatment of the wafer 21. In addition, the wafer-sucking surface of each of the tables 22,23 is slightly cut out only at four locations adjacent to the circumference thereof. Therefore, the temperature distribution of the wafer 21 is kept constant during its heat treatment, thereby successfully removing any danger of uneven drying.

Figure 7:
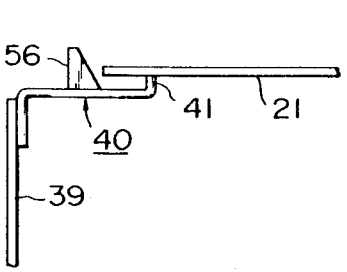
FIG. 7 is an enlarged side view illustrating another example of fingers.

By the way, a guide piece 56 which extends upwardly of the projection 41 may be provided at a longitudinal central portion of each finger 40 as illustrated in FIG. 7 so that the wafer 21 may be guided by the guide piece 56.

Needless to say, the conveyor mechanism of this invention may also be effectively utilized where there is one treatment table or where there are three or more treatment tables.

In the above-described embodiment, the fingers 40 are displaced up and down together with the supporting plates 39 via the vertically-displaceable shafts 38 by moving the guide walls 49 with the first air cylinder 48, and the fingers 40 are swung aside together with the supporting plates 39 via the links, etc. by means of the second air cylinder 54. The fingers 40 may also be moved up and down by pivotally securing the supporting plates 39 on the gate-shaped frames 31 and displacing the gate-shaped frames 31 up and down by means of a cam mechanism, and the fingers 40 may also be swung aside by always pressing the rollers turnably attached to the supporting plates 39 against tapered guide blocks which move up and down.

Alternatively, the fingers may also be swung aside by securing one end of a wire, which extends through each gate-shaped frame 31, to an end portion of a supporting plate 39 pivotally provided with the gate-shaped frame 31 and connecting the other end of the wire to a solenoid, air cylinder or the like.

Having now fully described the invention, it will be apparent to one of ordinary skill in the art that many changes and modifications can be made thereto without departing from the spirit or scope of the invention as set forth herein.

What is claimed is:

1. A conveyor mechanism for a thin plate, comprising:

a table defining at least four grooves in the upper surface thereof, two of said grooves extending substantially perpendicular to the direction of conveyance of the thin plate from one side of the table to peripheral parts of an area on which the thin plate is to be mounted, the remaining two of said grooves extending substantially perpendicular to the direction of conveyance of the thin plate from the other side of the table to peripheral parts of the area;

a frame surrounding both sides of the table and movable along both sides of the table; and at least four fingers movable up and down with respect to the frame and equipped at the inner ends thereof with upward projections which are adapted to support the thin plate, two of said fingers being located in the vicinity of one of the sides of the table and the remaining two of said fingers being located in the vicinity of the other side of the table so that the fingers may move downwardly into corresponding grooves and outwardly from their respective sides of the table so as to permit the thin plate to be mounted on the table and thereafter, the fingers moved inwardly into their corresponding grooves and upwardly so as to lift the thin plate from the table.

* * * * *